(12) United States Patent
Hou et al.

(10) Patent No.: US 10,176,573 B2
(45) Date of Patent: Jan. 8, 2019

(54) AUTOMATIC REGION-OF-INTEREST SEGMENTATION AND REGISTRATION OF DYNAMIC CONTRAST-ENHANCED IMAGES OF COLORECTAL TUMORS

(71) Applicant: AGENCY FOR SCIENCE, TECHNOLOGY AND RESEARCH, Singapore (SG)

(72) Inventors: Zujun Hou, Singapore (SG); Yue Wang, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 15/519,145

(22) PCT Filed: Oct. 13, 2014

(86) PCT No.: PCT/SG2014/000481
§ 371 (c)(1),
(2) Date: Apr. 13, 2017

(87) PCT Pub. No.: WO2016/060611
PCT Pub. Date: Apr. 21, 2016

(65) Prior Publication Data
US 2017/0243349 A1     Aug. 24, 2017

(51) Int. Cl.
*G06T 7/00*        (2017.01)
*G06K 9/46*        (2006.01)
(Continued)

(52) U.S. Cl.
CPC .............. *G06T 7/0012* (2013.01); *G06K 9/46* (2013.01); *G06T 7/12* (2017.01); *G06T 7/246* (2017.01);
(Continued)

(58) Field of Classification Search
None
See application file for complete search history.

(56) References Cited

U.S. PATENT DOCUMENTS

2011/0257519 A1* 10/2011 Bjornerud .............. A61B 5/055
                                                                    600/431
2013/0202173 A1*  8/2013 Buckler ................ G06T 7/0012
                                                                    382/131

FOREIGN PATENT DOCUMENTS

WO    WO 2007/059615 A1    5/2007
WO    WO 2007059615 A1 *   5/2007  ............... A61B 8/08
(Continued)

OTHER PUBLICATIONS

PCT International Search Report, 6 pgs. (dated Jan. 12, 2015).
(Continued)

*Primary Examiner* — Delomia L Gilliard
(74) *Attorney, Agent, or Firm* — Womble Bond Dickinson (US) LLP

(57) ABSTRACT

A method for dynamic contrast enhanced (DCE) image processing and kinetic modeling of an organ's region-of-interest is provided. The method includes deriving at least a contour of an exterior of the organ's region-of-interest from one or more of a plurality of images; generating a spline function in response to the derived contour of the exterior of the organ's region-of-interest from the one or more of the plurality of images; registering the plurality of images wherein the organ's region-of-interest has been segmented; deriving a tracer curve for the organ's region-of-interest in the registered images, the tracer curve indicating a change in concentration of a contrast agent flowing through the organ's region-of-interest over a time period; and kinetic modeling by fitting a kinetic model to the tracer curve to generate one or more maps of tissue physiological parameters associated with the kinetic model.

9 Claims, 14 Drawing Sheets

(51) Int. Cl.
    *G06T 7/73*         (2017.01)
    *G06T 7/12*         (2017.01)
    *G06T 7/33*         (2017.01)
    *G06T 7/246*       (2017.01)
    *G01R 33/56*      (2006.01)

(52) U.S. Cl.
    CPC ................... *G06T 7/33* (2017.01); *G06T 7/73* (2017.01); *G01R 33/5608* (2013.01); *G06T 2207/10096* (2013.01); *G06T 2207/20101* (2013.01); *G06T 2207/30028* (2013.01); *G06T 2207/30096* (2013.01)

(56) References Cited

FOREIGN PATENT DOCUMENTS

WO     WO 2010/014712 A1     2/2010
WO     WO 2010014712 A1 *     2/2010   ............ G01R 33/56

OTHER PUBLICATIONS

PCT Written Opinion of the International Searching Authority, 8 pgs. (dated Jan. 12, 2015).
PCT International Preliminary Report on Patentability (Chapter I of the Patent Cooperation Treaty), 9 pgs. (dated Apr. 18, 2017).

\* cited by examiner

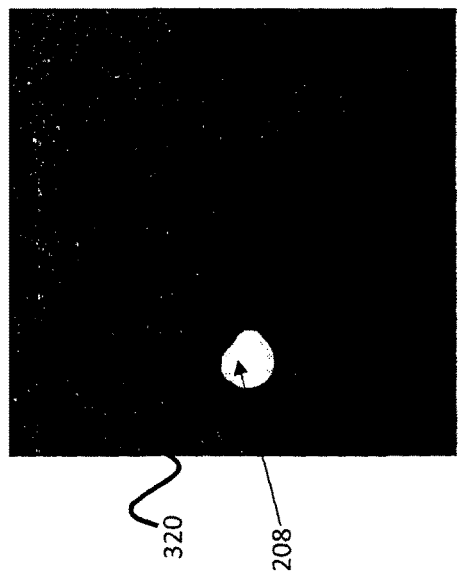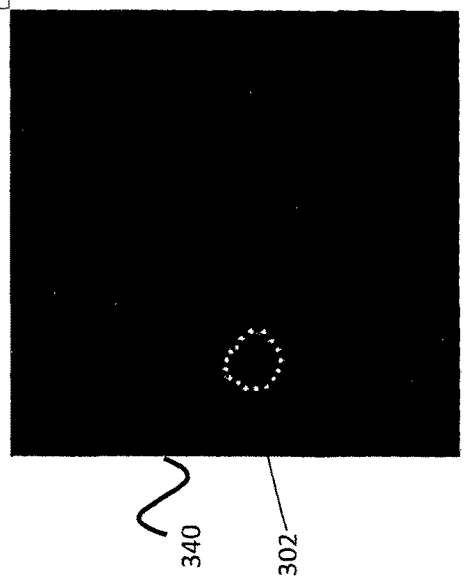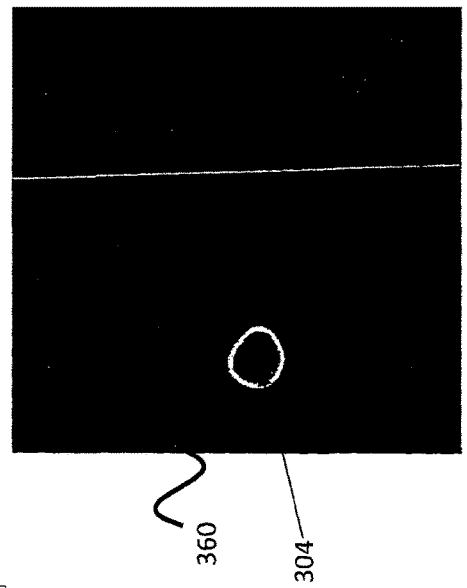

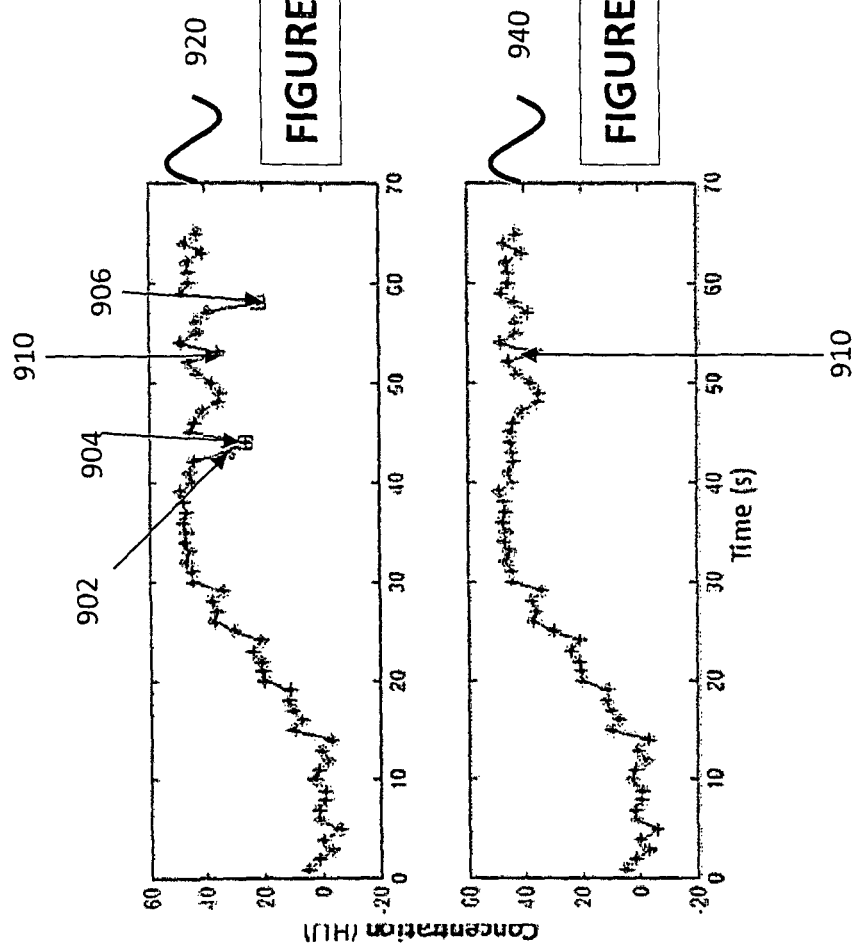

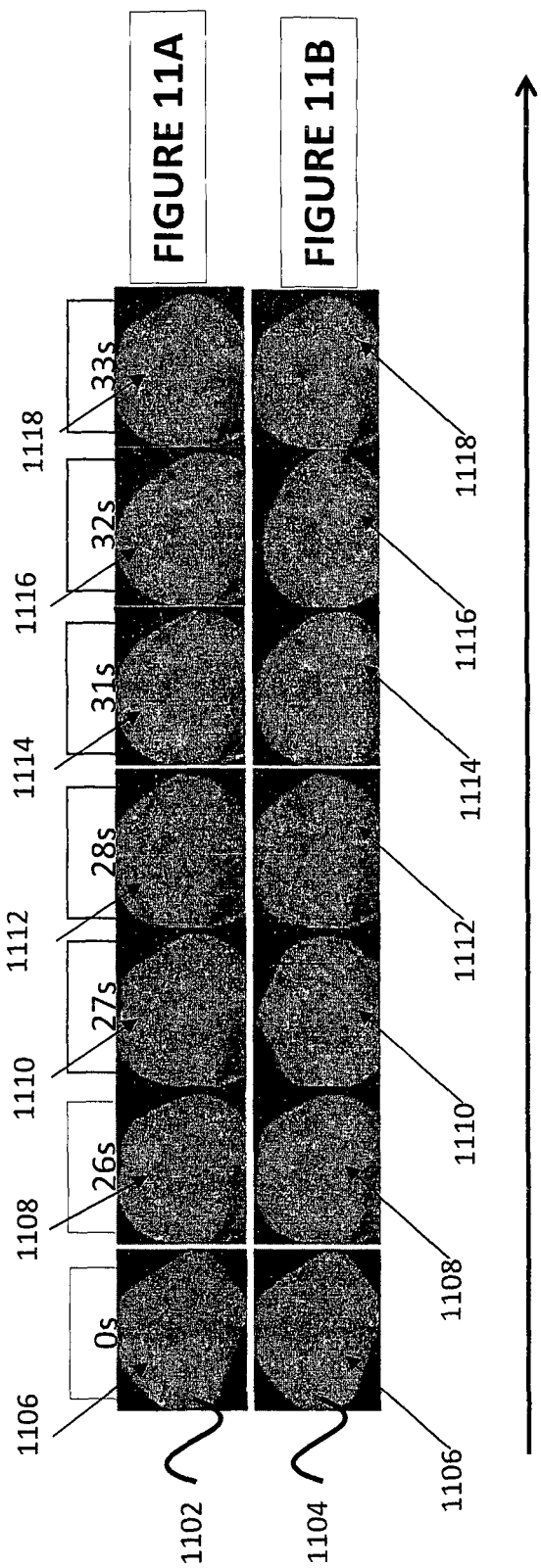

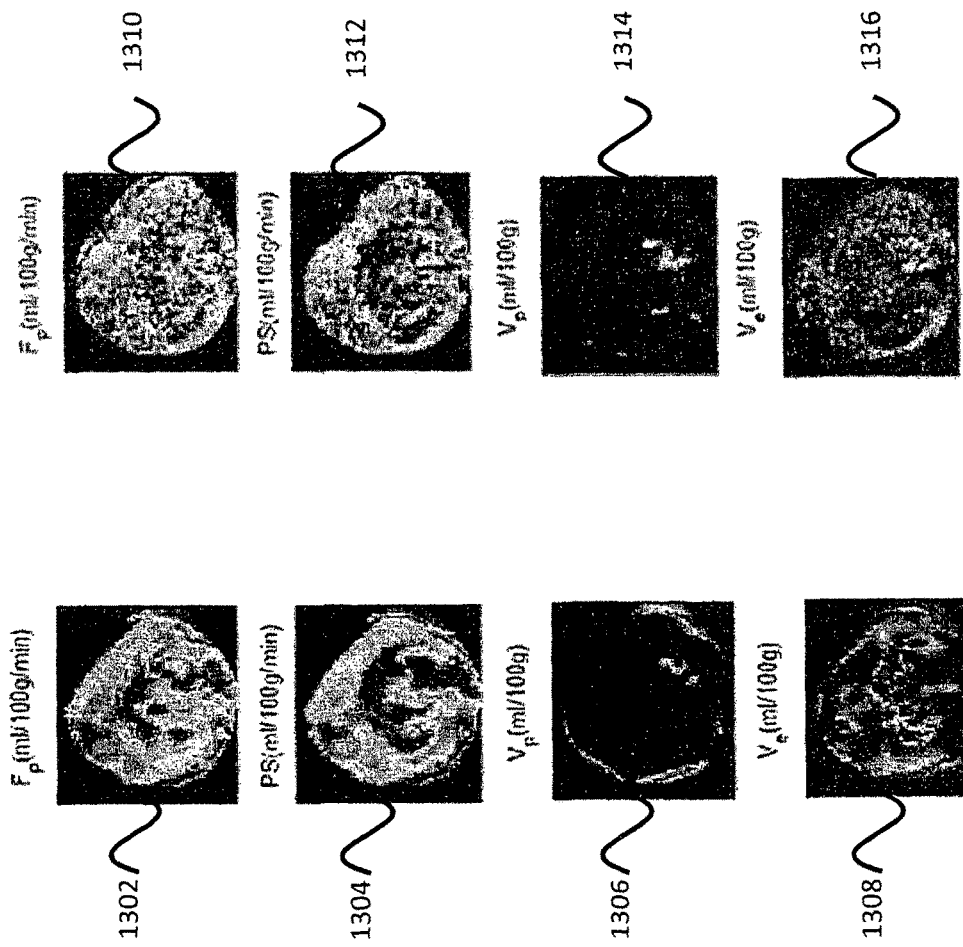

AUTOMATIC REGION-OF-INTEREST SEGMENTATION AND REGISTRATION OF DYNAMIC CONTRAST-ENHANCED IMAGES OF COLORECTAL TUMORS

CROSS-REFERENCE TO RELATED APPLICATION

This patent application is a U.S. National Phase Application under 35 U.S.C. § 371 of International Application No. PCT/SG 2014/000481, filed OCT. 13, 2014, entitled AUTOMATIC REGION-Of INTEREST SEGMENTATION AND REGISTRATION OF DYNAMIC CONTRAST-ENHANCED IMAGES OF COLORECTAL TUMORS.

FIELD OF THE INVENTION

The present invention relates to processing image sequences arising from dynamic contrast-enhanced (DCE) imaging for tumor disease diagnosis. In particular, it relates to pre-DCE modeling for segmenting and registering organ tissue of interest.

BACKGROUND

An important aspect of research related to biomedical science is the detection and analysis of tumors in organs. With current technology, images of the organs are often analyzed manually in order to detect presence of a tumor. However, manual analysis of images is both time-consuming and tedious.

One conventional technique commonly used is magnetic resonance imaging (MRI). MRI techniques are widely used to image soft tissue within human (or animal) bodies and there is much work in developing techniques to perform the analysis in a way which characterizes the tissue being imaged, for instance as normal or diseased. However, to date, conventional MRI only provides information about the tissue morphology and does not provide information about tissue physiology.

Malignant tissues or tumors have a number of distinguishing characteristics. For example, to sustain their aggressive growth they generate millions of tiny "micro-vessels" that increase the local blood supply around the tumor to sustain its abnormal growth. A technique which is based on this physiology is dynamic contrast-enhanced (DCE) imaging.

DCE imaging using computed tomography (CT) or magnetic resonance imaging (MRI) is a functional imaging technique that can be used for in vivo assessment of tumor microcirculation. In recent years, DCE imaging has attracted increasing research interest as a potential biomarker for antiangiogenic drug treatment.

DCE images uses outlining regions-of-interest, as well as image registration to correct for any body movement during imaging, before tracer kinetic analysis. Ideally, image registration should be performed with respect to the tissue of interest instead of the whole image domain, which implies that the tissue of interest must be segmented first. This would typically require the user to manually outline the region-of-interest on multiple (usually about 50 or more) DCE images which is both time-consuming and tedious.

Thus, what is needed is a method that is able to non-manually process images for segmenting an organ's region-of-interest. Furthermore, other desirable features and characteristics will become apparent from the subsequent detailed description and the appended claims, taken in conjunction with the accompanying drawings and this background of the disclosure.

SUMMARY

According to a first aspect of the invention, a method for dynamic contrast enhanced (DCE) image processing and kinetic modeling of an organ's region-of-interest is provided. The method includes deriving at least a contour of an exterior of the organ's region-of-interest from one or more of a plurality of images; generating a spline function in response to the derived contour of the exterior of the organ's region-of-interest from the one or more of the plurality of images; registering the plurality of images wherein the organ's region-of-interest has been segmented; deriving a tracer curve for the organ's region-of-interest in the registered images, the tracer curve indicating a change in concentration of a contrast agent flowing through the organ's region-of-interest over a time period; and kinetic modeling by fitting a kinetic model to the tracer curve to generate one or more maps of tissue physiological parameters associated with the kinetic model.

In accordance with another aspect, a method for registering an organ's region-of-interest is provided. The method includes deriving mutual information in response to each of a plurality of dynamic contrast enhanced (DCE) images; and aligning segments in the organ's region-of-interest in response to the mutual information.

BRIEF DESCRIPTION OF THE DRAWINGS

The accompanying figures where like reference numerals refer to identical or functionally similar elements throughout the separate views and which together with the detailed description below are incorporated in and form part of the specification, serve to illustrate various embodiments and to explain various principles and advantages in accordance with a present embodiment.

FIGS. 3A-3C illustrate images of an organ's region-of-interest during a spline function generation.

FIG. 9A illustrates a tissue concentration-time curve before outlier data points in the tissue concentration-time curve are removed.

FIG. 9B illustrates a tissue concentration-time curve after outlier data points in the tissue concentration-time curve are removed.

FIG. 11A illustrates images during registration in accordance with the method of mutual information over a time period.

FIG. 11B illustrates images during registration in accordance with the method of gradient correlation over a time period.

FIG. 13A shows maps of tissue physiological parameters associated with the kinetic model in accordance with an embodiment of the invention.

FIG. 13B shows maps of tissue physiological parameters associated with the kinetic model without registering the images.

DETAILED DESCRIPTION

Figure 1:
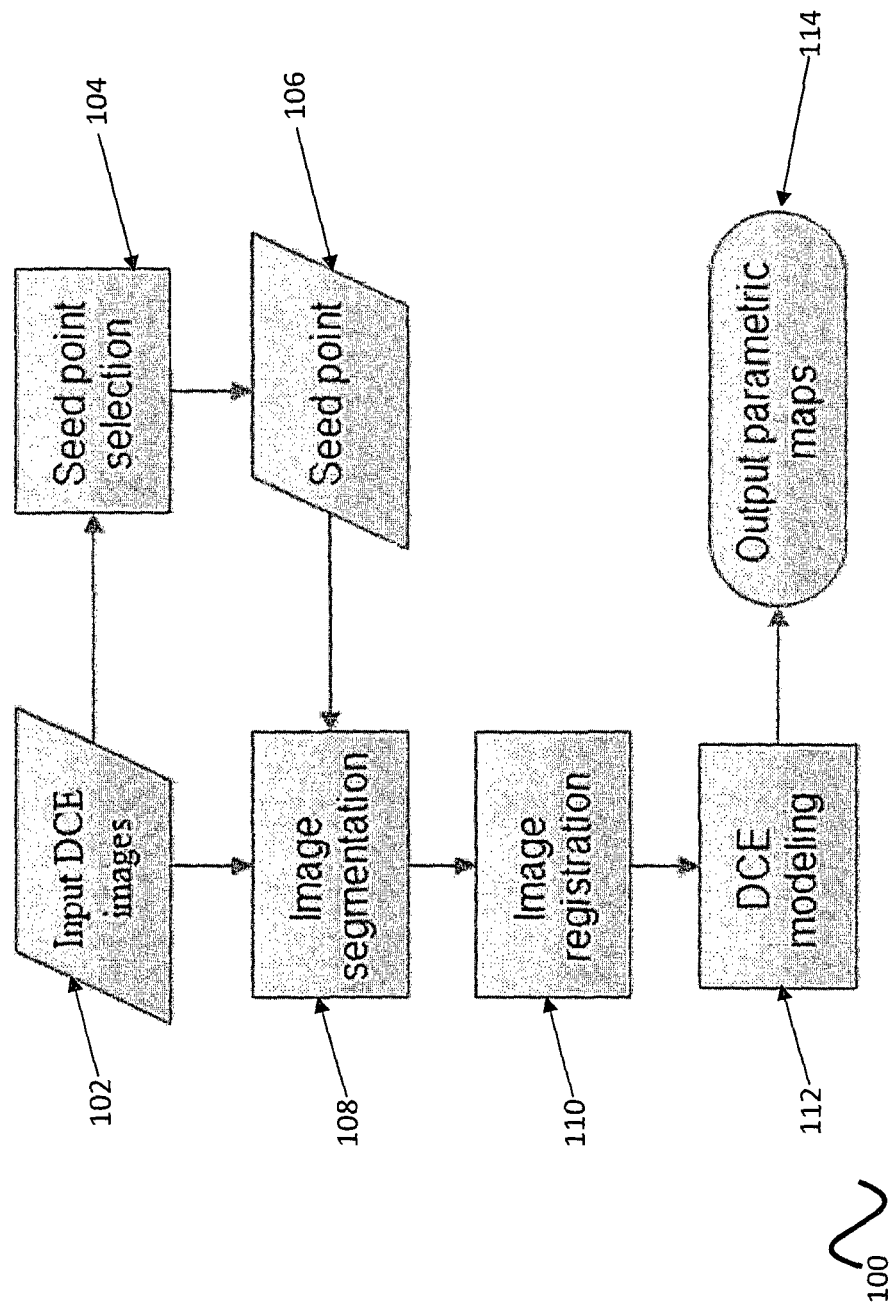
FIG. 1 shows a flowchart of a method for dynamic contrast enhanced (DCE) image processing and kinetic modeling of an organ's region-of-interest in accordance with an embodiment.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "deriving", "segmenting", "registering", "kinetic modeling", "scanning", "calculating", "determining", "replacing", "generating", "initializing", "processing", "outputting", or the like, refer to the action and processes of a computer system, or similar electronic device, that manipulates and transforms data represented as physical quantities within the computer system into other data similarly represented as physical quantities within the computer system or other information storage, transmission or display devices.

The present specification also discloses apparatus for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate. The structure of a conventional general purpose computer will appear from the description below.

In addition, the present specification also implicitly discloses a computer program, in that it would be apparent to the person skilled in the art that the individual steps of the method described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer readable medium may also include a hard-wired medium such as exemplified in the Internet system, or wireless medium. The computer program when loaded and executed on such a general-purpose computer effectively results in an apparatus that implements the steps of the preferred method.

With reference to FIG. 1, there is provided a method for dynamic contrast enhanced (DCE) image processing and kinetic modeling of an organ's region-of-interest in accordance with an embodiment. The method (designated generally as reference numeral 100) comprises the following steps:

Step 102: Input DCE Images.

For example, at least one or more DCE images are input into an apparatus for processing and kinetic modeling of an organ's region-of-interest. DCE images can be typically acquired at multiple time points and multiple slice locations of a tumor.

Step 104: Seed Point Selection.

Following step 102, the next step is to select a seed point. A user only needs to indicate the tissue of interest by making a selection on the tissue. This is also known as deriving at least a contour of an exterior of the organ's region-of-interest.

Step 106: Seed Point.

The location selected by the user in step 104 will serve as a seed point denoted by $f_{seed}^{curr}(x_0)$, which represents the image intensity at location $x_0$. An example seed point can be seen in FIG. 2A.

Step 108: Image Segmentation.

Following step 106, the next step is to segment the DCE image. The DCE image may be segmented into foreground (consisting of tissues) and background (mostly composed of air). In an embodiment, this can be accomplished by using a method like the Otsu's method. The Otsu's method is used to automatically perform clustering-based image thresholding, or reduce a graylevel image to a binary image. The algorithm assumes that the image contains two classes of pixels following bi-modal histogram (foreground pixels and background pixels) which then calculates the optimum threshold separating the two classes so that their combined spread (intra-class variance) is minimal.

In a DCE imaging dataset, there exists additional information from neighboring slices (from 3D spatial domain) and other time frames (from temporal domain) which relates to the tissue in the current image by either spatial continuity or temporal movement. This information is reflected in the similarity in object shape between neighboring slices and time frames. As such, a spline function is generated in response to the derived contour of the exterior of the organ's region-of-interest.

Step 110: Image Registration.

Following step 108, the next step is to segment the DCE image. In an embodiment, the DCE images are registered to focus on the tissue of interest and to crop the segmented region-of-interest.

Step 112: DCE Modeling.

Following step 110, the next step is to derive a tracer curve for each pixel in the organ's region-of-interest in the registered images, the tracer curve indicating a change in concentration of a contrast agent flowing through the organ's region-of-interest over a time period. The tracer curve can be fitted to a kinetic model to derive values of the associated physiological parameters.

Step 114: Output Parametric Maps.

Following step 110, the next step is to fit a kinetic model to the tracer curve to generate one or more maps of tissue physiological parameters associated with the kinetic model.

The method 100 includes segmentation, registration and kinetic modeling of an organ's region-of-interest. The segmentation and registration are important post-processing steps that can improve subsequent analysis of DCE images by kinetic modeling.

Figure 2A:
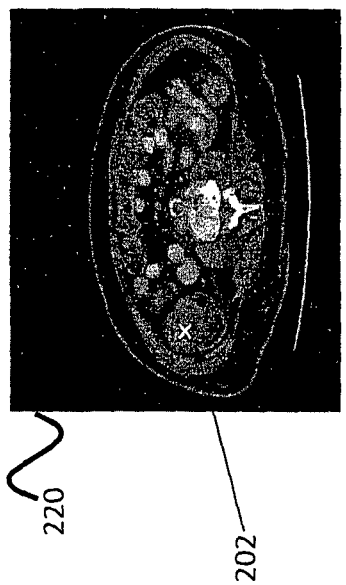
FIGS. 2A-2D illustrate images of an organ's region-of-interest during preliminary segmentation.

FIGS. 2A-2D illustrate images of the organ's region-of-interest during a preliminary segmentation. As mentioned in the above, a user only needs to indicate the tissue of interest by making a selection on the tissue. As shown in FIG. 2A as image 220, the location selected by the user in step 104 will serve as the seed point denoted by $f_{seed}^{curr}(x_0)$, which represents the image intensity at location $x_0$, shown as 202. Advantageously, the user does not have to manually outline a tissue or lesion to indicate a region-of-interest.

Figure 2B:
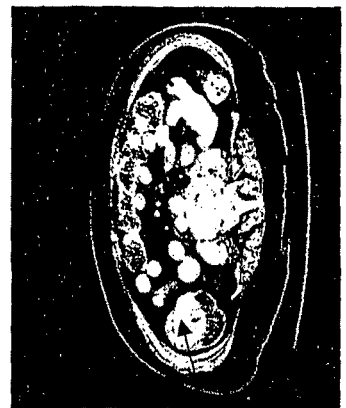

FIG. 2B shows an image 240 of the organ's region-of-interest after being segmented into foreground which mainly includes the tissues of the organ's region-of-interest. The methods that are conventionally used to segment the image does not take into account the spatial relationship between pixels. As such, the resulting segmentation map 240, shown in FIG. 2B, could be subject to intensity outliers, leading to the presence of holes within the segmented region-of-interest. Also, the tissue of interest would likely be in contact with another tissue and the boundary of the tissue of interest may not be well delineated.

Figure 2C:
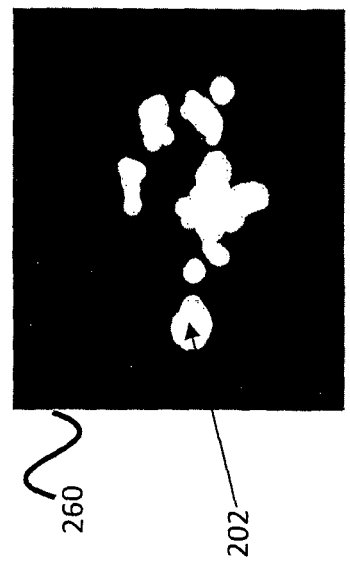

FIG. 2C shows an image 260 of the organ's region-of-interest after being morphological processed. Typically, morphological image processing is a collection of non-linear operations which probe an image with a small shape or template called structure element. The outputs of morphological image processing rely on the relative ordering of pixel values. The structure element is positioned at all possible locations in the image and compared with the corresponding neighborhood of pixels. The position where the structure element has been placed is called reference pixel, the choice of which is arbitrary. For example, A is an image, such as a binary image, and S is a structuring element. $S_{(i,j)}$ denotes the operation of placing S with its reference pixel at the pixel (i, j) of A. Two basic morphological operations, the erosion of A by S (denoted as A ⊖ S) and the dilation of A by S (denoted as A ⊕ S) can be defined as A ⊖ S={(i, j):$S_{(i,j)}$ ⊂ A} and A ⊕ S=(A$^c$ ⊖ S)$^c$, where A$^c$=1−A is the complement of A.

From this one can define the two widely used morphological operations, opening of A by S (denoted as $\psi_S(A)$ and closing of A by S (denoted as $\phi_S(A)$) are defined as $\psi_S(A)$=(A ⊖ S)⊕S' and $\phi_S(A)$=(A ⊕ S) ⊖ S', where S' is the reflection of S (namely rotation by 180° around its reference pixel). FIG. 2C illustrates the image 260 after performing a morphological image processing (for example, hole-filling and object-opening) using a disk-shaped structure element with a radius of 6 voxels. Typically, the shape of structure element and the size of the image 260 will depend on the image tissue characteristics.

Figure 2D:
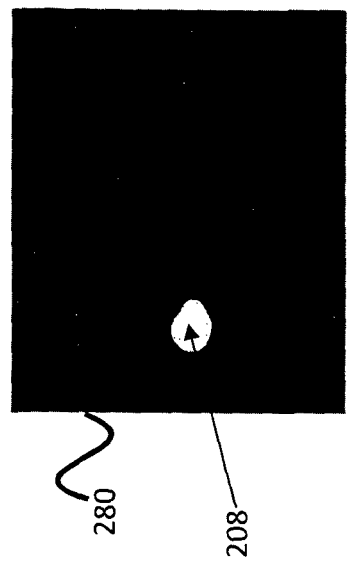

After that, the tissue containing the seed tissue point is segmented, as shown in FIG. 2D as image 280. For example, the seed tissue point is segmented by applying a 8-neighbourhood connected component analysis. More detail on the neighbourhood connected component analysis will be provided below. The image 280 showing the seed tissue point 280 after segmentation.

Subsequent to the preliminary segmentation of the images of the organ's region-of-interest, a spline function is generated. In an embodiment, a B-spline function is generated. A B-spline is a piecewise polynomial function of degree k as defined in a range $u_0 \leq u \leq u_m$. The points $u=u_j$ are the meeting places of the polynomial pieces, known as knots. The i-th B-spline basis function of degree k, $B_{i,k}(u)$, can be derived recursively by the Cox-de Boor recursion formula:

$$B_{i,0}(u) = \begin{cases} 1, & \text{if } u_i \leq u \leq u_{i+1} \\ 0, & \text{otherwise} \end{cases} \quad (1)$$

$$B_{i,k}(u) = \frac{u - u_i}{u_{i+k-1} - u_i} B_{i,k-1}(u) + \frac{u_{i+k} - u}{u_{i+k} - u_{i+1}} B_{i+1,k-1}(u). \quad (2)$$

Basis function $B_{i,k}(u)$ is non-zero on $[u_i, u_{i+k+1})$. On any knot span $[u_i, u_{i+1})$, at most k+1 basis functions of degree k are non-zero. Given n+1 control points $P_0, P_1, \ldots, P_n$ and m+1 knots $u_0, u_1, \ldots, u_m$, the B-spline curve of degree k defined by these control points and knots is $$C(u) = \Sigma_{i=0}^{n} B_{i,k}(u) P_i \quad (3)$$

The shape of the B-spline curve can be changed, through modifying the positions of control points, the positions of knots or the degree of the curve. Note that n, m and k satisfy m=n+k+1. By repeating certain knots and control points, the start and end of the generated curve can be joined together forming a closed loop, which can conveniently be utilized to encode the shape information of a segmented object.

After the preliminary segmentation, the shape of the segmented ROI can be characterized by its contour, using n+1 control points that are uniformly spaced. Then a B-spline curve can be reconstructed through equations (2) to (3) which will be an approximation of the object contour.

FIGS. 3A-3C illustrate images of an organ's region-of-interest during a spline function generation. FIG. 3A shows an image 320 obtained from the preliminary segmentation. In an embodiment, image 320 is identical to image 280. FIG. 3B shows image 340 having sampled control points 302 from the derived contour of the organ's region-of-interest. FIG. 3C shows a segmented image 360 having a seed point 304 that is constructed based on a B-spline function.

Tissues in consecutive neighboring frames and slices could share similarities in shape information, which can be used for further refinement of the segmented regions. Let $\wp_{last}$ denote the n+1 control points in the last frame/slice, and $\wp_{last}(i)$ refers to the i-th control point. $\wp_{curr}$ may be used to denote the control points in the current frame or slice. Various approaches can be implemented to impose shape similarity constraints. For example, the positions of control points in $\wp_{curr}$ can be varied so that predefined objectives function of $\wp_{last}$ and $\wp_{curr}$ become optimal.

For example, on the current image, let the region identified by the preliminary segmentation procedure be denoted by $\Omega_{curr}$, and $\partial\Omega_{curr}$ denotes its boundary. From $\partial\Omega_{curr}$, a point which is the nearest to the i-th control point in $\wp_{last}$ can be determined:

$$P_i^{curr} = \min_j d(\partial\Omega_{curr}(j), \wp_{last}(i)), \quad (4)$$

where $d(\cdot)$ stands for a distance function (for example, the Euclidean distance). A collection of points $\{P_i^{curr}, i=0,\ldots,n\}$ can serve as the control points of the new tissue region which adds the shape information from last frame or slice to the segmentation result based on information from current image alone.

Figure 4B:
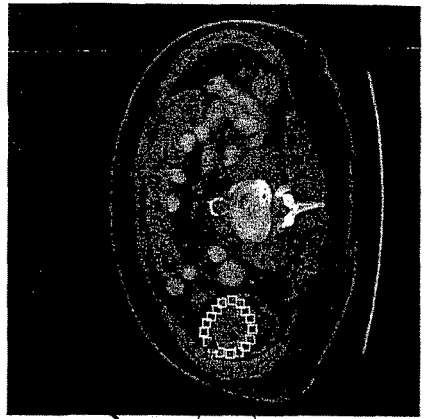
FIGS. 4A-4D illustrate images of an organ's region-of-interest during segmentation in accordance with the spline function.
Figure 4D:
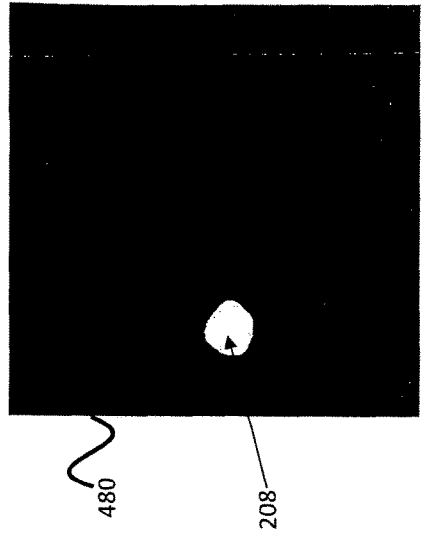
Figure 4A:
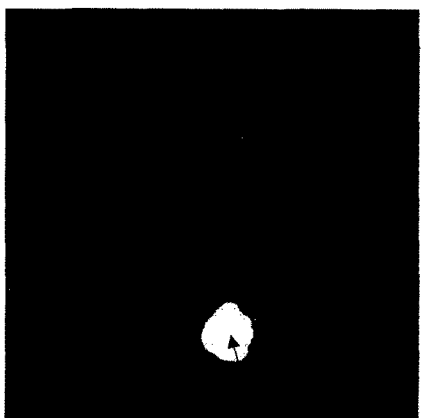
Figure 4C:
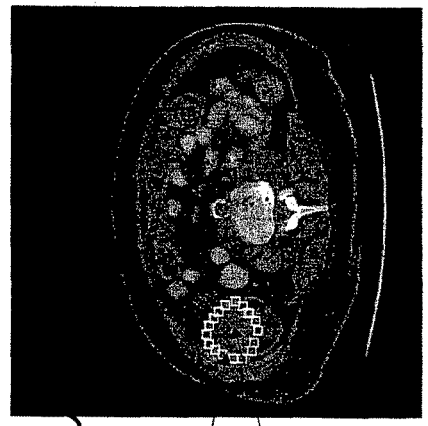

FIGS. 4A-4D illustrate images of the organ's region-of-interest during segmentation in accordance with the spline function. FIG. 4A shows an image 420 obtained from a preliminary segmentation. In an embodiment, image 420 is identical to image 280. FIG. 4B shows the image 440 having control points 404 from the previous frames, which are obtained in accordance with the spline function, around a selection point 402. FIG. 4C shows an image 460 of the organ's region-of-interest with refined control points 406 in the current frame. FIG. 4D shows the image 480 of the organ's region-of-interest after segmentation in accordance with the spline function. In an embodiment, the image 480 is identical to image 280.

Figure 5:
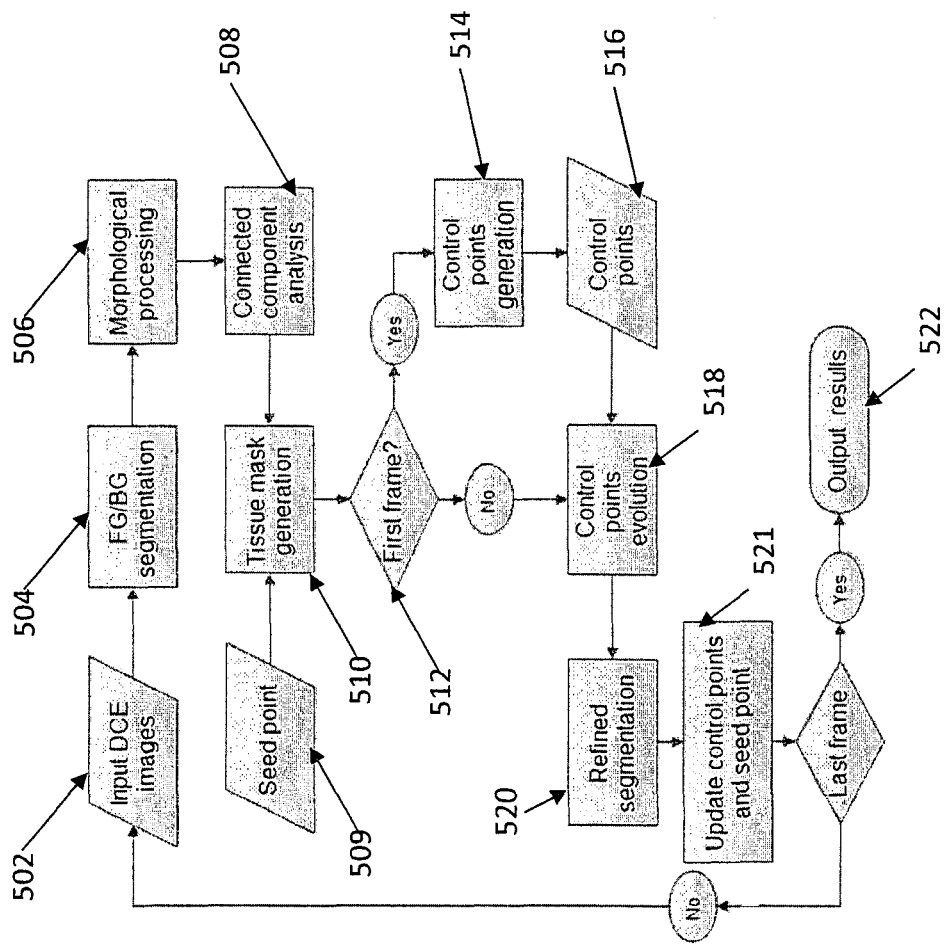
FIG. 5 shows a flowchart of a method for segmenting each of a plurality of DCE images.

FIG. 5 shows a flowchart 500 of a method for segmenting each of a plurality of DCE images. At least one or more DCE images are input into an apparatus for processing and kinetic modeling of an organ's region-of-interest in step 502. The one or more DCE images are segmented into foreground (consisting of tissues) and background (mostly composed of air) in step 504. The segmented images are then morphological processed in step 506. A connected component analysis is carried out in step 508. For a connected component analysis, in order for two pixels (say p, q) to be connected, their values must both be 1 for a binary image and the pixels should be neighbors. In image processing, there are usually two types of neighborhoods. For a pixel p with coordinates(i,j), the set of pixels given by:

$$N_4(p) = \{(i+1,j), (i-1,j), (i,j+1), (i,j-1)\} \quad (5)$$

This is also known as a 4-neighborhood connected component analysis. In order to determine a 8-neighborhood connected component, the following equation is used:

$$N_8(p) = N_4(p) \cup \{(i+1,j+1), (i+1,j-1), (i-1,j+1), (i-1,j-1)\} \quad (6)$$

Two pixels are considered to 8-neighborhood connected if both pixels have value 1 and are within 8-neighborhood to one another The results of the connect component analysis in step 508 and a seed point selection in 509 are used to generate a tissue mask in step 510. During a tissue mask generation 510, a determination step 512 is carried out to find out if the tissue mark is a first frame. In the event that it is a first frame, control points are generated in step 514. The control points are obtained in step 516. In the event that it is not a first frame, control points are evolved in step 518. In step 518, if pixel p at location (i, j) of a previous frame is a control point, then the pixel at location of (i, j) of a current frame will be labelled as a control point. This process of evolving the information of control points from previous frame to current frame is called control points evolution. The control points obtained in steps 514 and 518 are used to refine segmentation in step 520. The control points and seed point are updated in step 521. This information is helpful for segmenting the tissue of interest in the next frame or slice. These processes repeat until the last frame or slice and the output results are generated in step 522.

Figure 6:
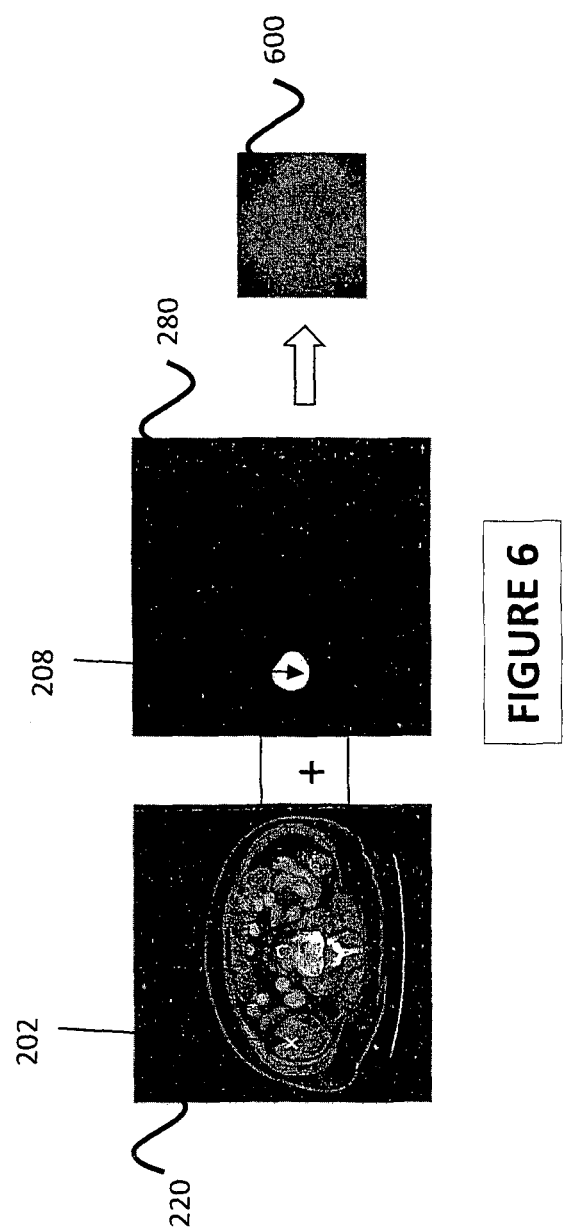
FIG. 6 illustrates images of an organ's region-of-interest during a registration of an organ's region-of-interest.

FIG. 6 illustrates images of an organ's region-of-interest during a registration of an organ's region-of-interest. FIG. 6 shows an image 220 having a location x (or 202) which has been selected from the organ's region-of-interest. FIG. 6 also shows an image 280 which is obtained from the preliminary segmentation. FIG. 6(c) shows how the selected location x is cropped in image 280, registered and then magnified for better resolution, as shown in image 600. Advantageously, registration of DCE images focus on the organ's region-of-interest by cropping and magnifying the selected area.

The image registration process is to find a transform T that will map one image f onto another image g so that a predefined criterion that measures the similarity of two images is optimized. Both rigid and non-rigid transformations can be applied for registration. While rigid transformation allows for only translational and rotational displacements between two images, non-rigid methods allows for deformable changes displacements between two images, non-rigid methods allows for deformable changes in tissue shape and size, with the deletion of existing voxels (or information) and the generation of new voxels through some form of interpolation or approximation methods. Advantageously, rigid methods tend to preserve the original information in the aligned region and are usually more robust and efficient than non-rigid methods.

In an embodiment, the registration process is used on colorectal tumors. For colorectal tumors, formation of a tumor is usually not drastic and only involves minor variations in the sizes of the cropped images. A rigid registration method based on mutual information (MI) which minimizes variation in the cropped images may be used. For the application of the rigid registration method, possible missing or additional data due to variations in cropped image sizes can be treated as outliers in the tissue concentration-time curves, which can be detected before kinetic analysis by model-fitting. More details on the MI method are provided below, followed by its application on DCE images.

Shannon's Entropy

Let $p_i$ denote the frequency of intensity i appearing in an image, and p(f) refers to the histogram (i.e., intensity distribution) of image f. Then Shannon's entropy is defined as $$H = -\Sigma_i P_i \log P_i, \quad (7)$$

which measures the dispersion in the image histogram.

Joint Entropy

Let $p_{i,j}$ denote the frequency of the pair of intensities (i, j) occurring in a pair of images and p(f, g) refers to the resulting 2-D histogram of images f and g. If the images are perfectly registered, the occurrence of intensity pairs will be very focused (localized) in the 2-D histogram. On the other hand, the dispersion in the 2-D histogram will be large for misaligned images. Naturally, to quantify the degree of histogram dispersion, a joint entropy can be defined in a similar way:

$$H(f, g) = -\Sigma_{i,j} P_{i,j} \log P_{i,j}. \quad (8)$$

Images can be registered by minimizing the joint entropy.

Mutual Information

The mutual information of two images can be defined as:

$$I(f, g) = \sum_{i,j} p_{i,j} \log\left(\frac{p_{i,j}}{p_i p_j}\right), \quad (9)$$

which measures the inherent dependence between images. If the images are independent, then $P_{i,j}=P_i P_j$ and the mutual information is 0. It can be shown that $$I(f, g)=H(f)+H(g)-H(f, g), \quad (10)$$

and thus, maximizing the mutual information is equivalent to minimizing the joint entropy. Mutual information includes the entropy of individual image, which would be advantageous in registering images.

Figure 7:
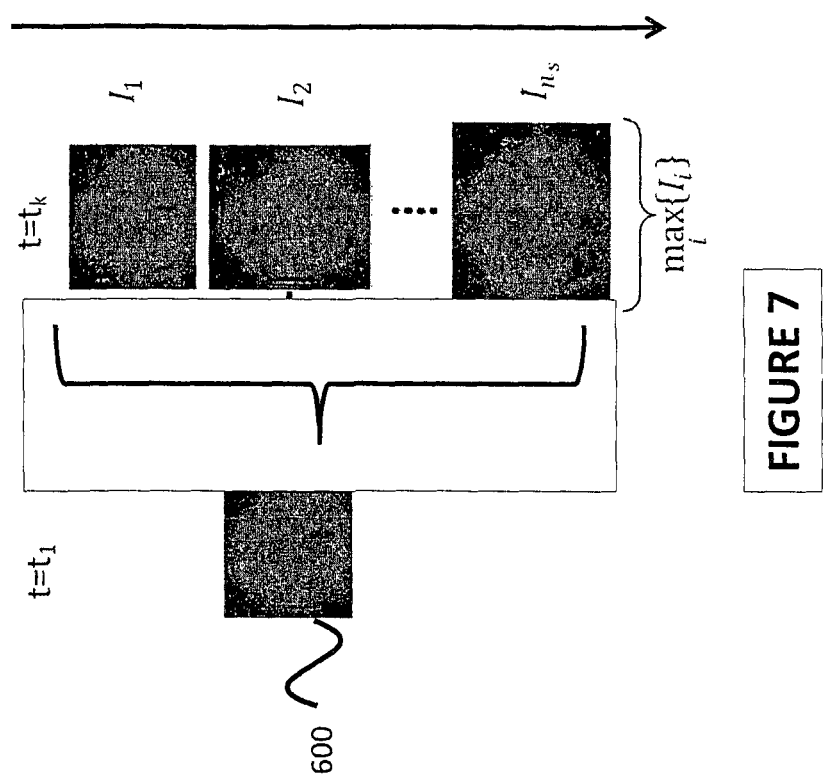
FIG. 7 illustrates images of an organ's region-of-interest during a registration of an organ's region-of-interest over a time period.

FIG. 7 illustrates images of an organ's region-of-interest during a registration of an organ's region-of-interest over a time period. For DCE imaging, usually a few slices (or locations) of the tissue of interest are obtained at each time-point (t). Suppose there are $n_s$ slices acquired at each time point, and there are $n_t$ time points in the DCE dataset. For a particular slice at one point of time $t_1$, the problem is to identify a slice among all slices at time $t_k$ that is most aligned with the targeted slice at $t_1$. To achieve this, each slice at time $t_k$ will be registered with the targeted slice at $t_1$ by the mutual information method, yielding optimal transformation parameters (rotation and translation) as well as the corresponding value of mutual information. After registering all $n_s$ slices at time $t_k$, the slice with the maximum mutual information will be selected as the desired candidate. This registration process is illustrated in FIG. 11A.

Tracer curve refers to a change in concentration of a contrast agent at a voxel or in an organ's region-of-interest as derived from registered DCE images. A contrast agent typically refers to a substance that is comparatively opaque to x-rays that is introduced into an area of a body so as to contrast an internal part with its surrounding tissue in radiographic visualization. A voxel typically refers to a value on a three-dimensional space. Kinetic modeling is usually performed by fitting a kinetic model on a tracer curve derived at a voxel or for the organ's region-of-interest.

Generalized Tofts Model

The generalized Tofts model is commonly used for fitting of DCE images, and its residue function is given by:

$$R_{Tofts}(t) = K_{trans} \exp\left\{-\frac{K_{trans}}{v_e}t\right\} + v_p \delta(t), \quad (11)$$

where $\delta(t)$ is the Dirac delta function and $K^{trans}$ is the transfer constant. $v_p$ and $v_e$ denote the fractional vascular and interstitial volumes, respectively.

Adiabatic Approximation to Tissue Homogeneity Model

The residue function of the adiabatic approximation to tissue homogeneity (AATH) model is given by:

$$R_{AATH}(t) = \mathcal{H}(t) - \mathcal{H}(t-T_c) + E\mathcal{H}(t-T_c)\exp\left\{-\frac{EF_p}{v_e}(t-T_c)\right\}, \quad (12)$$

where $H(t)$ is the Heaviside step function, $T_c$ is the capillary transit time, $F_p$ is the blood (plasma) flow and E is the extraction fraction. These parameters are related to the vascular fractional volume $v_p$ and permeability-surface area product PS by:

$$T_c = \frac{v_p}{F_p}, \quad (13)$$

$$E = \frac{PS}{F_p + PS}, \quad (14)$$

Thus, the free parameters used for fitting the AATH model are $\{v_e, v_p, F_p, PS\}$.

Model-fitting

Figure 8:
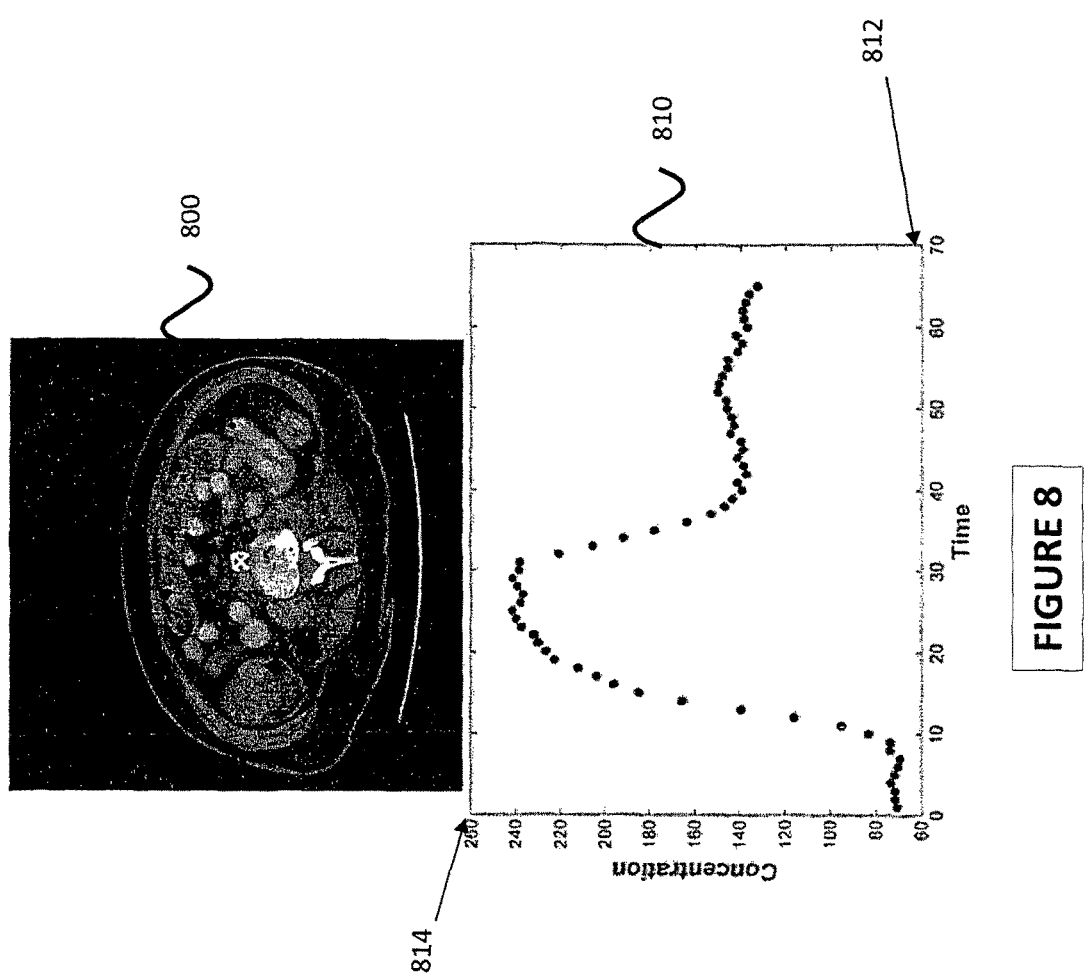
FIG. 8 shows a tracer concentration-time curve.

Tissue tracer concentration-time curves $C_{tiss}(t)$ sampled from DCE images are fitted using the above tracer kinetic models by minimizing the following cost function:

$$X^2(\vec{\theta})=\Sigma_{t_k}(C_{tiss}(t_k)-F_p C_p \otimes R(t_k))^2, \quad (15)$$

where $\vec{\theta}$ represents the parameters in the tracer kinetic model, and $\otimes$ is the convolution operator. $C_p(t)$ refers to the tracer concentration-time curve in a feeding artery and it is commonly called the arterial input function. FIG. 8 shows a tracer concentration-time curve 810 obtained from sampling from a descending aorta visible on the DCE image 800. The graph 810 is plotted concentration 814 against time 812.

FIG. 9A illustrates a tissue concentration-time curve $C_{tiss}$(t) before outlier data points in the tissue concentration-time curve are removed. FIG. 9A shows that outlier data points 902, 904 and 906 that are distant from other data points (e.g. data point 910) on the curve 920. The outlier data points 902, 904 and 906 can be detected using robust regression based methods.

FIG. 9B illustrates a tissue concentration-time curve 940 after outlier data points in the tissue concentration-time curve are removed. The outlier data points 902, 904 and 906 shown in FIG. 9A are removed and replaced by interpolated values as shown in FIG. 9B. Data points that are not distant from the other data points on the curve are not removed, for example data point 910. In this manner, outlier data points can be detected and removed before model-fitting.

Figure 10B:
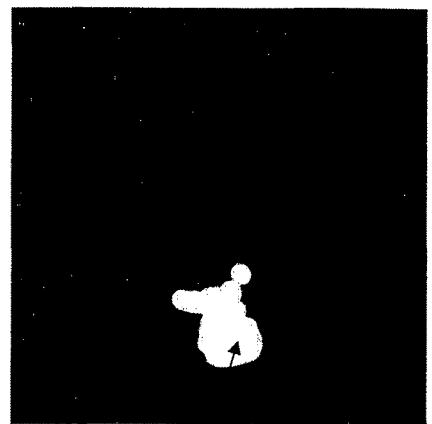
FIGS. 10A-10D illustrates how propagated shape information can help to resolve the problem of under segmentation due to adjoining tissues.
Figure 10D:
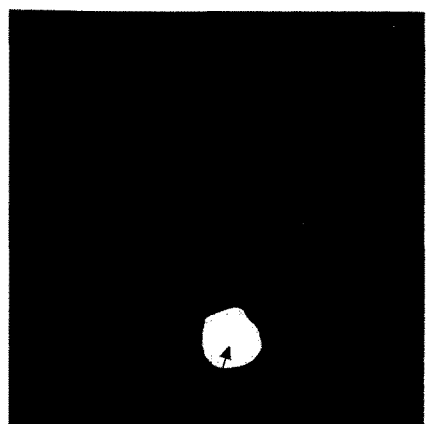
Figure 10A:
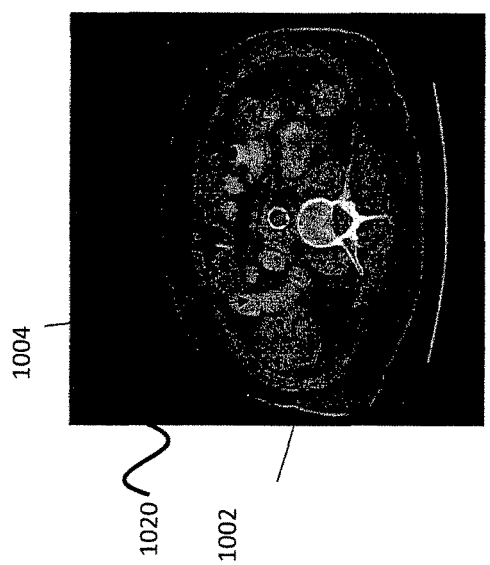

FIGS. 10A-10D illustrates how propagated shape information can help to resolve the problem of under segmentation due to adjoining tissues. FIG. 10A shows an image 1020 of the organ's region-of-interest with a selected location $x_0$ shown as 1002. However, during imaging, neighboring tissues 1004 and structures could be displaced relative to each other. A main difficulty in segmentation is the occasional presence of adjoined neighboring tissues, which could result in under-segmentation.

FIG. 10B shows an image 1040 of the organ's region-of-interest after a preliminary segmentation in which neighboring tissues in contact with the selected location $x_0$ are also segmented. FIG. 10B shows a location 1006 which includes the selected location 1002 and the neighboring tissues 1004.

Figure 10C:
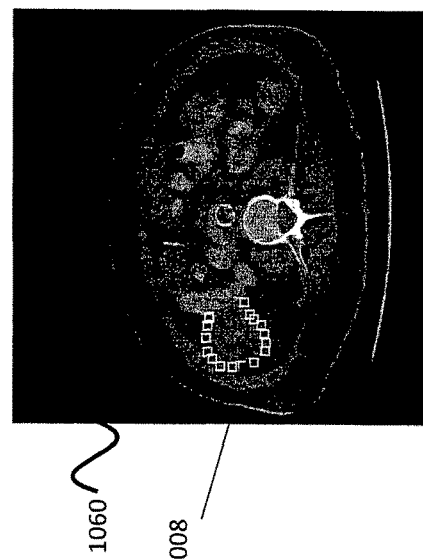

FIG. 10C shows an image 1060 of the organ's region-of-interest after propagating control points 1008 obtained from the previous frame or slice. The control points 1008 are generated based on the derived contour of a previous frame and in accordance with the B-spline function. FIG. 10D shows the final result 1080 of the selected location 1010 after the adjoining tissues have been removed in accordance with the B-spline control points.

FIG. 11A illustrates images 1102 obtained during registration in accordance with the method of mutual information over a time period. FIG. 11B illustrates images 1104 during registration in accordance with the method of gradient correlation over a time period. In both FIGS. 11A and 11B, the image 1106 at t=0 serves as the template to which subsequent images 1108, 1110, 1112, 1114, 1116 and 1118 are registered. Mutual information compares image intensity, whereas gradient correlation computes the similarity of image gradient. Typically, image gradient is more sensitive to noise then image intensity. However, image gradient could be more discriminative in object description if the object features are consistent throughout the aligned images. This may not be true for tumors in DCE imaging due the wash-in and wash-out of tracer. For the results shown in FIGS. 11A and 11B, it can be seen that from images 1112 and 1114, the tumor at time points 27s and 32s are better aligned with the neighboring frames by the mutual information method than the gradient correlation method.

During DCE imaging, tissue intensity will change along with the wash-in and wash-out of a contrast agent which flow through the organ's region-of-interest over a time period. Consequently, tissue image features will be inconsistent throughout the process. For example in FIG. 11A, where the central region of the tumor appears to be hypointense after about 26 seconds. Segmentation which relies on the detection of object features, such as active contours, would yield inconsistent results among the DCE images at different time points.

Figure 12B:
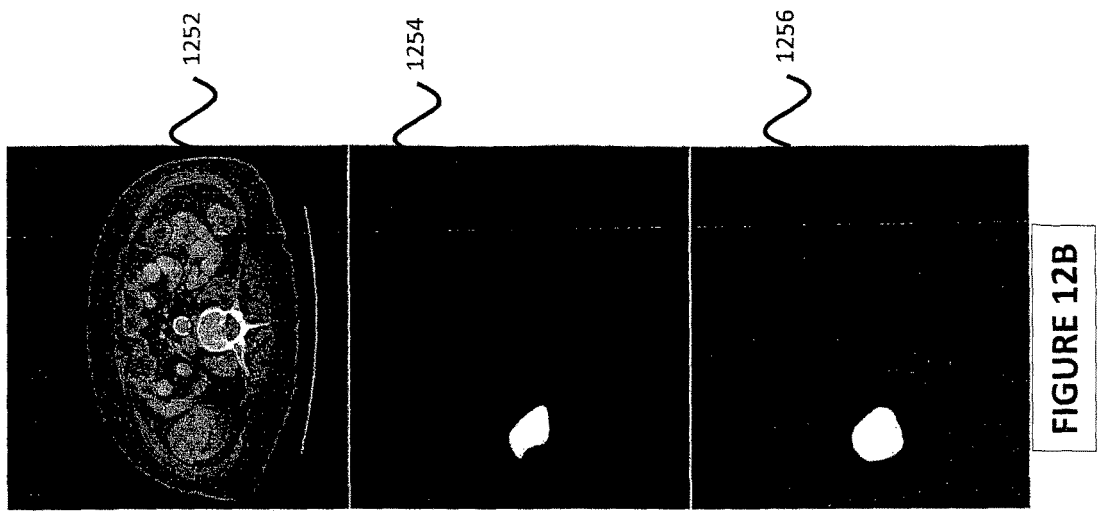
FIG. 12B shows images obtained by a method according to an embodiment of the invention.
Figure 12A:
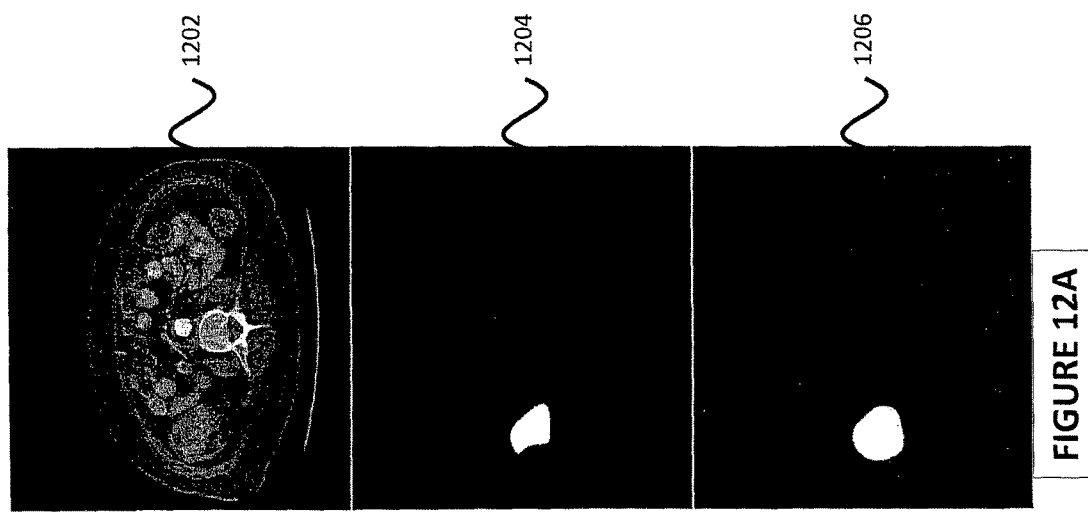
FIG. 12A shows images obtained by segmentation by a conventional method.

FIG. 12A shows images 1202, 1204 and 1206 obtained by segmentation by a conventional method, for example a B-snake method. FIG. 12B shows images 1252, 1254 and 1256 obtained by a method according to an embodiment of the invention. As an active contour model, the B-snake method evolves the contour according to object boundaries where the contour is encoded using B-splines. The B-snake method over-segments these images because the contour is trapped by the hypo-intense region within the tumor.

FIG. 13A shows maps of tissue physiological parameters 1302, 1304, 1306 and 1308 associated with the kinetic model in accordance with an embodiment of the invention, for example the AATH model. FIG. 13B shows maps of tissue physiological parameters 1310, 1312, 1314 and 1316 associated with the kinetic model without registering the images. The maps generated with image registration 1302, 1304, 1306 and 1308, shown in FIG. 13A, clearly delineate a region near the center of the tissue, which has lower PS, lower $v_p$ and higher $v_e$ mentioned in Equations (11), (12) and (14). In contrast, the maps without registration 1310, 1312, 1314 and 1316, shown in FIG. 13(b), reveal a similar region, but are generally noisier.

Figure 14:
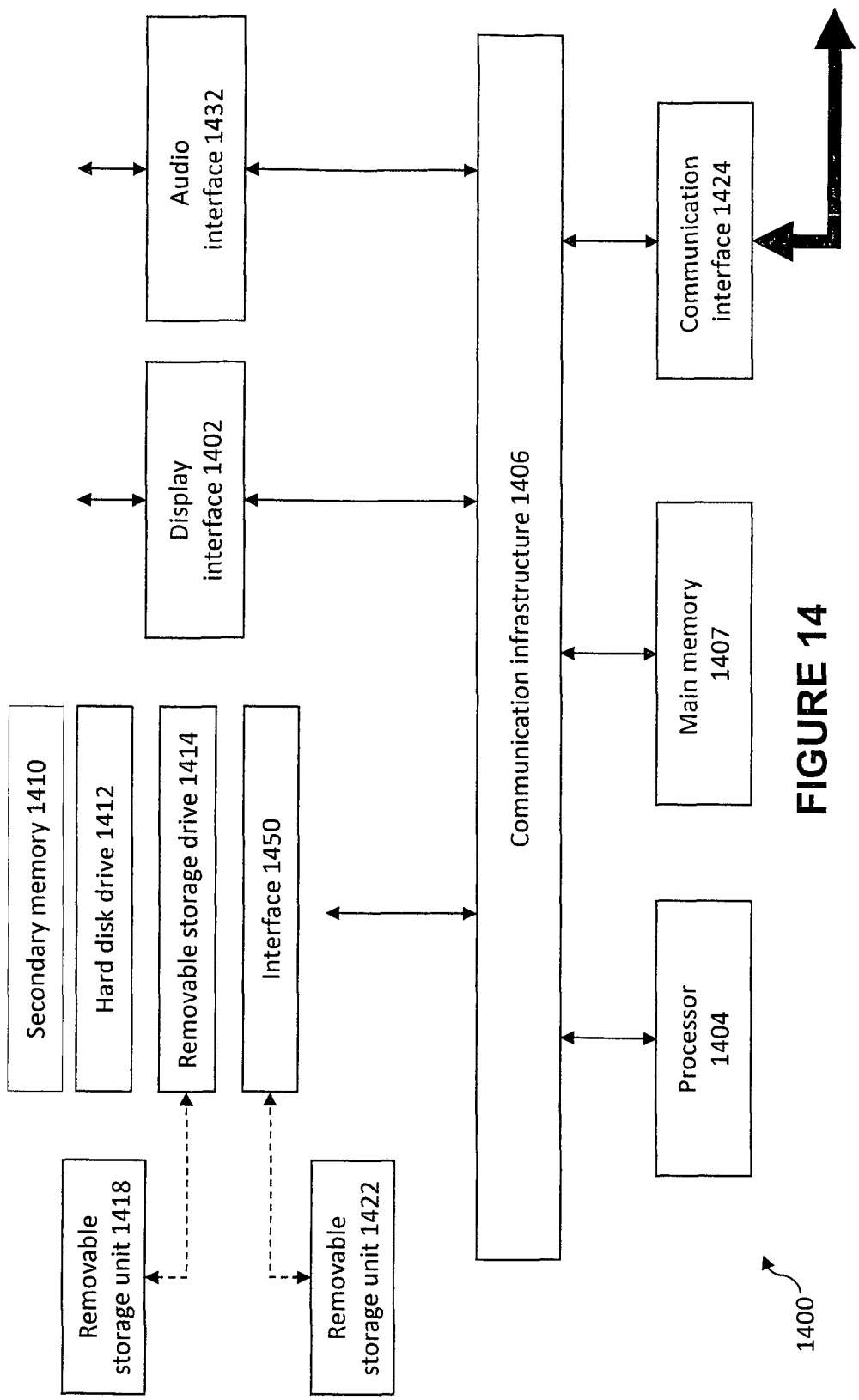
FIG. 14 shows an exemplary computing device in accordance with an embodiment of the invention.

As shown in FIG. 14, the computing device 1400 further includes a display interface 1402 which performs operations for rendering images to an associated display 1430 and an audio interface 1432 for performing operations for playing audio content via associated speaker(s) 1434.

As used herein, the term "computer program product" may refer, in part, to removable storage unit 1418, removable storage unit 1422, a hard disk installed in hard disk drive 1412, or a carrier wave carrying software over communication path 1426 (wireless link or cable) to communication interface 1424 via an interface 1450. A computer readable medium can include magnetic media, optical media, or other recordable media, or media that transmits a carrier wave or other signal. These computer program products are devices for providing software to the computing device 1400. Computer readable storage medium refers to any non-transitory tangible storage medium that provides recorded instructions and/or data to the computing device 1400 for execution and/or processing. Examples of such storage media include floppy disks, magnetic tape, CD-ROM, DVD, Blu-ray Disc™, a hard disk drive, a ROM or integrated circuit, USB memory, a magneto-optical disk, or a computer readable card such as a PCMCIA card and the like, whether or not such devices are internal or external of the computing device 1400. Examples of transitory or non-tangible computer readable transmission media that may also participate in the provision of software, application programs, instructions and/or data to the computing device 1400 include radio or infra-red transmission channels as well as a network connection to another computer or networked device, and the Internet or Intranets including e-mail transmissions and information recorded on Websites and the like.

The computer programs (also called computer program code) are stored in main memory 1408 and/or secondary memory 1410. Computer programs can also be received via the communication interface 1424. Such computer programs, when executed, enable the computing device 1400 to perform one or more features of embodiments discussed herein. In various embodiments, the computer programs, when executed, enable the processor 1404 to perform features via a communication infrastructure 1406 of the above-described embodiments. Accordingly, such computer programs represent controllers of the computer system 1400.

Software may be stored in a computer program product and loaded into the computing device 1400 using the removable storage drive 1414, the hard disk drive 1412, or the interface 1420. Alternatively, the computer program product may be downloaded to the computer system 1400 over the communications path 1426. The software, when executed by the processor 1404, causes the computing device 1400 to perform functions of embodiments described herein.

It is to be understood that the embodiment of FIG. 14 is presented merely by way of example. Therefore, in some embodiments one or more features of the computing device 1400 may be omitted. Also, in some embodiments, one or more features of the computing device 1400 may be integrated. Additionally, in some embodiments, one or more features of the computing device 1400 may be split into one or more component parts.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

What is claimed is:

1. A method for dynamic contrast enhanced (DCE) image processing and kinetic modeling of an organ's region-of-interest to identify a tumor in the organ, the method comprising:
   receiving, on an image of the organ and from a user, a seed point-of-interest that indicates a single point on the organ without requiring the user to outline a tissue or a lesion to indicate a region-of-interest;
   deriving, from the seed point-of-interest, at least a contour of an exterior of the organ's region-of-interest from one or more of a plurality of images;
   generating a spline function in response to the derived contour of the exterior of the organ's region-of-interest from the one or more of the plurality of images;
   segmenting the organ's region-of-interest in accordance with the spline function;
   registering the plurality of images wherein the organ's region-of-interest has been segmented;

deriving a tracer curve for the organ's region-of-interest in the registered images, the tracer curve indicating a change in concentration of a contrast agent flowing through the organ's region-of-interest over a time period; and kinetic modeling by fitting a kinetic model to the tracer curve to generate one or more maps of tissue that show physiological parameters used to identify the tumor.

2. The method according to claim 1, wherein segmenting the organ's region-of-interest comprises generating segments for each of the plurality of images which include the organ's region-of-interest.

3. The method according to claim 2, wherein segmenting each of the plurality of images comprises:

identifying a plurality of voxels of the organ's region-of-interest in each of the plurality of images; and dividing the organ's region-of-interest in each image into segments in response to the identified plurality of voxels.

4. The method according to claim 3, wherein generating the spline function comprises encoding information on the derived contour of the exterior of the organ's region-of-interest for facilitating the segmentation of a successive image.

5. The method according to claim 1, wherein the organ's region-of-interest is a tumor.

6. The method according to claim 5, wherein the tumor is a colorectal tumor.

7. The method according to claim 1, wherein the kinetic model is based on a Tofts model.

8. The method according to claim 1, wherein the kinetic model is based on an adiabatic approximation to tissue homogeneity (AATH) model.

9. The method according to claim 1, wherein the spline function is a B-spline function.

* * * * *